United States Patent
Khandekar et al.

(10) Patent No.: US 10,937,690 B2
(45) Date of Patent: Mar. 2, 2021

(54) SELECTIVE DIELECTRIC DEPOSITION

(71) Applicant: Micron Technology, Inc., Boise, ID (US)

(72) Inventors: Anish Khandekar, Boise, ID (US); Lars P. Heineck, Boise, ID (US); Silvia Borsari, Boise, ID (US); Zhiqiang Xie, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/364,841

(22) Filed: Mar. 26, 2019

(65) Prior Publication Data

US 2020/0312712 A1   Oct. 1, 2020

(51) Int. Cl.
*H01L 21/768* (2006.01)
*H01L 21/311* (2006.01)

(52) U.S. Cl.
CPC .. *H01L 21/76832* (2013.01); *H01L 21/76831* (2013.01); *H01L 21/31116* (2013.01)

(58) Field of Classification Search
CPC ......... H01L 21/76831; H01L 21/76832; H01L 21/31116
USPC ........................................................ 438/696
See application file for complete search history.

(56) References Cited

U.S. PATENT DOCUMENTS

| 7,662,693 B2 | 2/2010 | Bhattacharyya |
| 7,875,529 B2 | 1/2011 | Forbes et al. |
| 8,274,777 B2 | 9/2012 | Kiehlbauch |
| 2014/0054713 A1* | 2/2014 | Lee ..................... H01L 27/1211 257/368 |
| 2019/0181041 A1* | 6/2019 | Lu ..................... H01L 21/76819 |
| 2020/0105690 A1* | 4/2020 | Li ..................... H01L 21/28247 |

OTHER PUBLICATIONS

AZO Materials, "Silicon Nitride (Si3N4) Properties and Applications" via https://web.archive.org/web/20170321201300/https://www.azom.com/properties.aspx?ArticleID=53 (Year: 2017).*

* cited by examiner

*Primary Examiner* — Binh X Tran
(74) *Attorney, Agent, or Firm* — Brooks, Cameron & Huebsch, PLLC (57) ABSTRACT

Methods, apparatuses, and systems related to selectively depositing a liner material on a sidewall of an opening are described. An example method includes forming a liner material on a dielectric material of sidewalls of an opening and a bottom surface of an opening and removing the first liner material of the sidewalls of the opening and the bottom surface of the opening using a non-selective etch chemistry. The example method further includes forming a second liner material on the dielectric material of the sidewalls of the opening to avoid contact with the bottom surface of the opening.

18 Claims, 11 Drawing Sheets

SELECTIVE DIELECTRIC DEPOSITION

TECHNICAL FIELD

The present disclosure relates generally to semiconductor devices and methods, and more particularly to selective deposition of a material on a sidewall of an opening.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD),

2 plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device.

Formation of such an opening may allow for the opening to be filled by a variety of materials. For example, the opening can be filled with a conductive fill comprising a variety of different materials. A dielectric material may be formed on the sidewalls of the opening to keep a conductive portion of the sidewalls separate from a conductive fill. If the conductive fill makes contact with the conductive portion of the sidewalls, it may cause a short. The dielectric material can be deposited using a non-selective deposition which can cover sidewalls and a bottom surface of the opening, e.g., a trench, formed therein. The bottom surface of the opening can be conductive. An etch can be used to remove the dielectric material covering the bottom surface of the opening to later establish electrical contact with the conductive bottom surface. An etch to remove the dielectric material covering the bottom of the opening may also damage the dielectric material on the sidewalls.

This damage to the sidewalls can contribute to unintended consequences related to the data access, storage, and/or processing functions of the memory device. For example, as described further herein, the damage caused to the dielectric material of the sidewalls of the opening may increase a probability of a short circuit fault when using a memory device.

The present disclosure includes methods, apparatuses, and systems related to selective deposition of a dielectric material on a sidewall of an opening, e.g., a trench formed among semiconductor structures on a substrate. An example of a method described herein includes forming a liner material on a sidewall of an opening and bottom surface of the opening. The example method further includes removing the liner material from the sidewall and bottom to expose a bottom surface of the opening, and then selectively depositing a second liner material on the sidewalls of the opening.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 110 may reference element "10" in FIG. 1, and a similar element may be referenced as 610 in FIG. 6.

Figure 1:
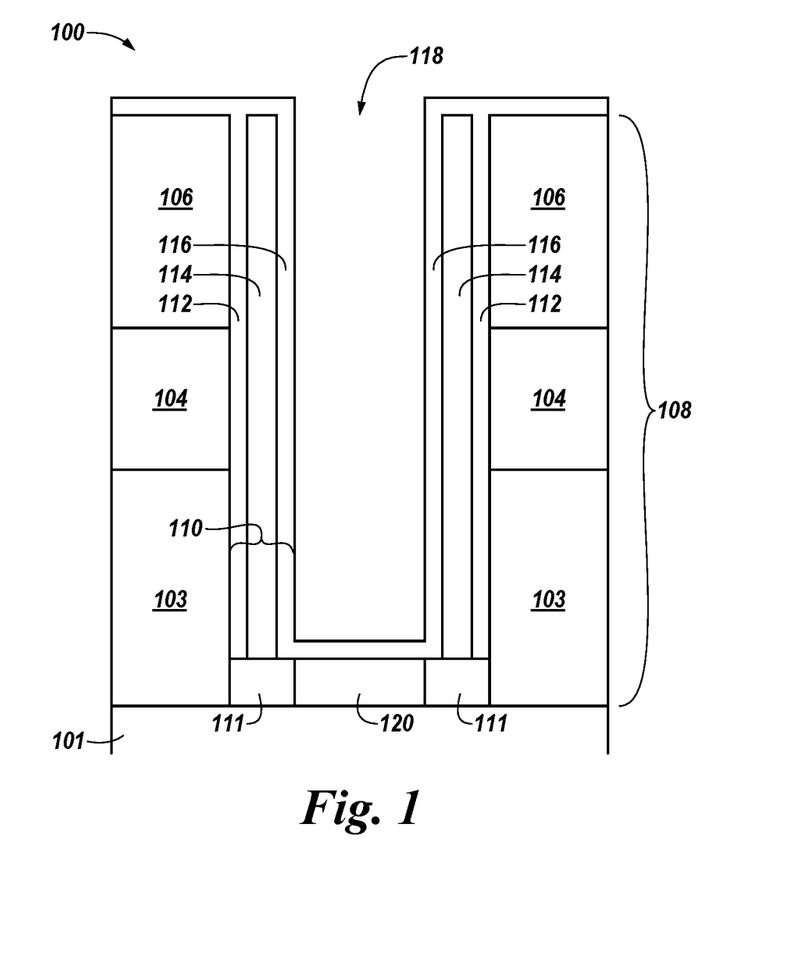
FIGS. 1-3 illustrate cross-sectional views of a prior art example of a memory device at various points in time in an example fabrication sequence.
Figure 2:
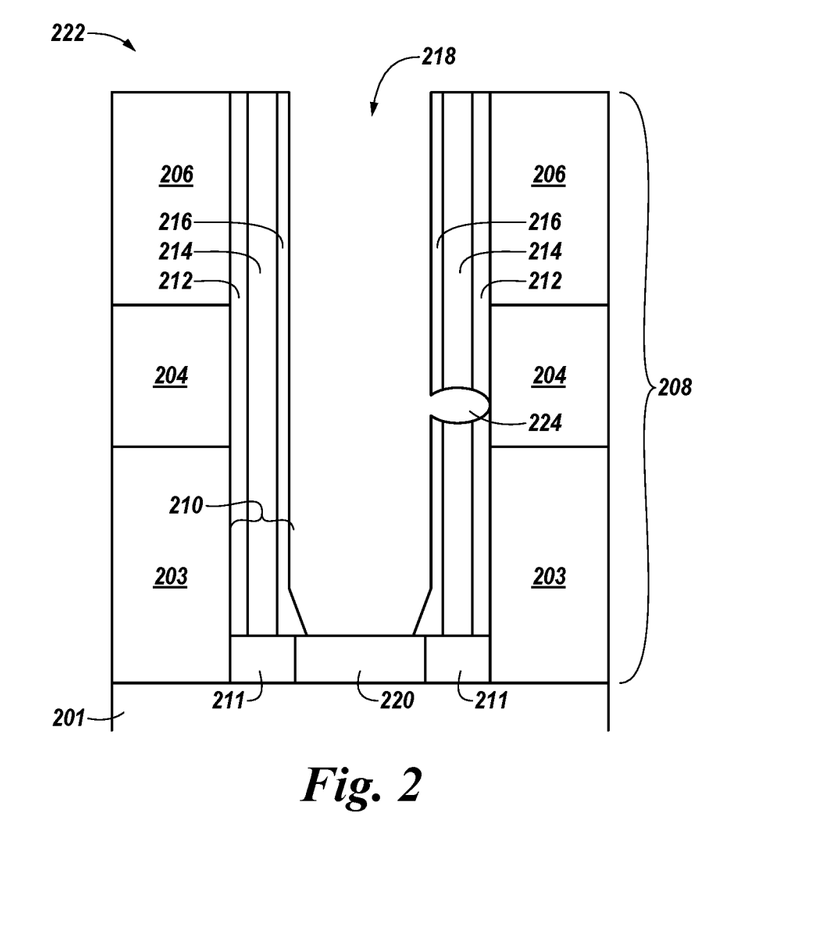
Figure 3:
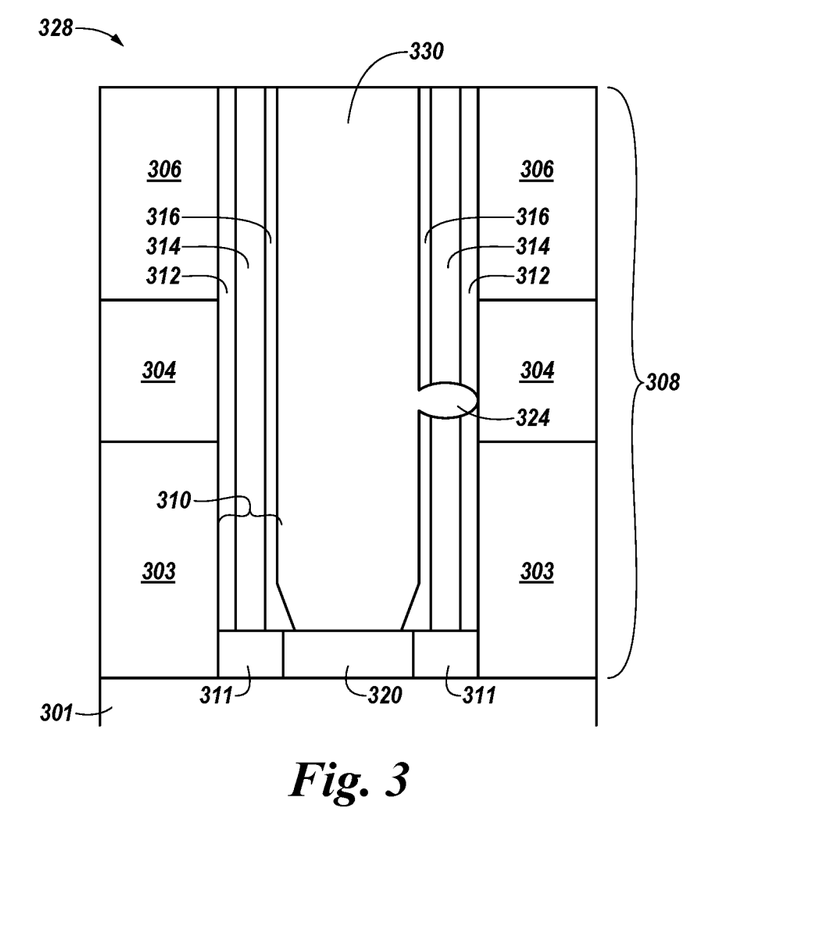

FIGS. 1-3 illustrate previous approach to a cross-sectional view of a portion of an example memory device at a point 100 in time in an example semiconductor fabrication sequence. The fabrication sequence illustrated in FIG. 1 is shown at a point 100 in time that corresponds to various processing activities already having been performed in the fabrication sequence.

A sidewall 108 can be formed from a conductive material and a dielectric material. Semiconductor structures formed on a substrate can include access devices, e.g, transistors, and storage nodes, e.g., capacitor cells, in an example memory array. A dynamic random access memory (DRAM) array is one form of example memory array that can be formed from semiconductor structures fabricated through a semiconductor fabrication process to a substrate on a wafer. The memory array may have an of array of access devices and storage nodes forming memory cells at the intersection of rows and columns. An access line, e.g., wordline (WL), may be used to activate an access device, e.g., metal oxide semiconductor field effect transistor (MOSFET), to access, e.g., turn "on" or "off" access, to the storage node, e.g., capacitor cell, of a memory cell. A sense line, e.g., bit line (BL) may be used to read and/or write, e.g., program, to and/or from a storage node of the memory cells.

A first conductive material 103 of a sidewall 108 is shown to have been formed on an underlying substrate material 101. The substrate material 101 may be formed from various undoped or doped materials on which various other materials may be deposited, masked, etched, etc., to form semiconductor structures thereon. Examples of a relatively inert undoped substrate material 101 may include monocrystalline silicon (monosilicon), polycrystalline silicon (polysilicon), and amorphous silicon, among other possibilities.

The first conductive material 103 may, in a number of embodiments, have been formed from a polysilicon and doped. Polysilicon is a high purity, polycrystalline form of silicon. Polysilicon can be used as a conducting gate material in metal oxide semiconductor field effect transistor (MOSFET) and complementary metal-oxide semiconductor (CMOS) technology.

The first conductive material 103 may be originally formed (e.g., deposited) as a layer on a surface of the underlying substrate material 101. For example, the first conductive material 103 may be formed without an opening 118 formed therein from an upper surface of the first conductive material 103 to the surface of the underlying substrate material 101. A second conductive material 104 can be formed on the first conductive material 103. A second conductive material 104 is shown to have been formed on a surface of the first conductive material 103. The second conductive material 104 can be tungsten. Other doping and processing steps may be performed as part of the fabrication process to create semiconductor structures. A dielectric material 106 may be formed on a surface of the second conductive material 104. The dielectric material 106 may be formed out of a nitride. The nitride material may be formed from a nitride material selected for dielectric or resistance properties. For example, one or more dielectric materials and/or nitrides may be selected from boron nitride (BN), silicon nitride (SiNx, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the dielectric material 106.

A masking, patterning and etching process may be performed to create trenches forming an opening from a top surface of the dielectric material 106 down through the second conductive material 104 and the first conductive material 103 to an underlying conductive contact 120 and spacers 111 on the substrate 101, thus separating first conductive material 103 and the second conductive material 104 into pillars 108. Embodiments, however, are not limited to this example processing sequence.

A dielectric spacer 110 may be formed on a sidewall 108 of the opening 118. A dielectric material 110 may be deposited to protect the integrity of and/or electrically isolate the semiconductor structure along a sidewall 108 of the pillars forming the opening, e.g., trench 118, during subsequent processing and discrete device completion and subsequent use from damage. The damage the dielectric spacer 110 may protect the sidewall 108 from can include damage from subsequent processes such as etching.

Etching is a process to chemically remove different semiconductor materials selectively and/or non-selectively from among different portions of semiconductor structures on a substrate during the fabrication process. Two types of etchants are liquid-phase (wet) and plasma-phase (dry). Wet etching uses etchants in liquid form. During a wet etch, a wafer, e.g., a silicon wafer forming a substrate and upon which semiconductor structures are formed, can be immersed in a bath of etchant and agitated to achieve good process control. For example, buffered hydrofluoric acid (BHF) can be used to etch silicon dioxide over a silicon substrate. As an alternative to immersion, certain semiconductor fabrication tools and equipment, e.g., a semiconductor processing chamber housing a substrate material, may employ a gas to cushion and protect one side of the wafer while an etchant is applied to the other side.

Plasma etching tools and equipment can operate in several modes by adjusting the parameters of a plasma gas applied to a wafer undergoing a fabrication process. The plasma produces energetic free radicals, neutrally charged, that react at the surface of the wafer. In a plasma etch, neutral particles attack the wafer from all angles. The source gas for the plasma usually contains small molecules rich in chlorine or fluorine.

The dielectric spacer may be formed on a sidewall 108 of the pillars using a chemical vapor deposition (CVD) process within fabrication equipment such as a CVD chamber. In one embodiment, the dielectric spacer 110 can be a laminate dielectric. A laminate dielectric is a dielectric material formed from multiple layers of dielectric material. For example, a laminate dielectric can be formed from three layers of dielectric material. The first layer 112 of the laminate dielectric can be formed from a low dielectric constant (k) material. An example of a low dielectric constant k material may be a material having a dielectric constant k of less than or equal to 4.2. In other embodiments, the first layer 112 of the laminate dielectric material can be formed from a nitride. The second layer 114 of the laminate dielectric can be formed out of an oxide, and the third layer 116 of a laminate dielectric material can be formed out of a nitride. The third layer 116 of the laminate dielectric material 110 can be formed on the first layer 112 and second layer 114 of the laminate dielectric 110, as well as the bottom surface 120 of the opening 118.

The k value of the laminate dielectric 110 can be found by combining the k values of each of the three layers of the laminate dielectric 110 according to the series of parallel plate capacitors equation. The k value of the laminate dielectric 110 can also be found by averaging the k of the first layer 112, the second layer 114, and the third layer 116 of the laminate dielectric 110. The laminate dielectric can be formed to have a lower k than a dielectric material made out of solid nitride. Nitride can have a k value of approximately 7.0. However, the laminate dielectric can have a dielectric constant k value of approximately 4.2 or less.

FIG. 2 illustrates a cross-sectional view of a semiconductor fabrication sequence at another point 222 in time after the example fabrication sequence described in connection with FIG. 1, in accordance with a number of embodiments of the present disclosure.

The point 222 in time of the fabrication sequence illustrated in FIG. 2 shows that a portion of the laminate dielectric 210 has been removed. An etching process removed the third layer 216 from the bottom surface 220. The etch used to remove the third layer 216 can be a plasma etch.

The plasma etch can cause damage to the dielectric layer 210. For example, the energetic free radicals of the plasma etch, and other processes, can remove material, e.g., the third layer 216, in a non-selective manner and diminish the integrity of the laminate dielectric 210 on the sidewalls 208. The damage can include causing pinholes 224 in the dielectric spacer 210. A pinhole is a tiny puncture made by, or as if it was made by, a pin. Damaging the third layer 216 of the spacer dielectric can expose the first layer 212 and the second layer 214 of the dielectric spacer 210 to damage. Damage to the first layer 212 and second layer 214 of the dielectric spacer 210 can also result in the formation of a pinhole 224. If a pinhole 224 is formed through all three layers of the dielectric spacer 210, a material used to fill the opening 218 can travel through the pinhole 224 and reach the sidewall 208.

After etching, the third layer 216 of the dielectric spacer 210 on the bottom surface 220 of the opening 218 is removed. The etch may not completely remove the third layer 216 from the bottom surface 220. The third layer 216 remaining from the etch can take up space on the bottom surface 220 of the opening 218. The space occupied by the third layer 218 is space that can not be used to conduct. As shown in FIG. 2, the remaining third layer 216 of the dielectric spacer 210 on the bottom surface 220 can be contiguous to the portion of the third layer 216 on the sidewall 208 and the bottom surface 220 of the opening simultaneously.

FIG. 3 is analogous or similar to FIG. 2. FIG. 3 illustrates filling the opening (e.g. opening 218 as illustrated in FIG. 2) while the dielectric spacer 310 is damaged. FIG. 3 illustrates a short caused by damage to the dielectric spacer 310.

As shown in FIG. 3, a conductive fill 330 can fill the opening. The conductive fill 330 can be polysilicon. As the conductive fill 330 fills the opening, some of the conductive fill 330 can travel through a pinhole 324. The pinhole 324 can allow the conductive fill 330 to travel through the layers of the dielectric spacer 310 that are formed to keep the conductive fill 330 separate from the sidewalls 308. By traveling through the dielectric spacer 310 and making contact with a conductive material of the sidewall 308, an electric current applied to the conductive fill 330 can travel to the conductive material of the sidewall 308 and cause a short circuit.

A short circuit is an electrical circuit that allows an electrical current to travel along an unintended path with no or very low electrical impedance. As stated above, a plasma etch can cause damage to the dielectric spacer 310 that results in the formation of a pinhole 324 through the dielectric spacer 310. A conductive fill 330 used to fill the opening, can travel through the dielectric spacer 310 through the pinhole 324. The conductive fill 330 may make contact with conductive material of the sidewall 308 and create an unintended path for the electrical current to travel through. This can result in a short circuit.

Figure 4:
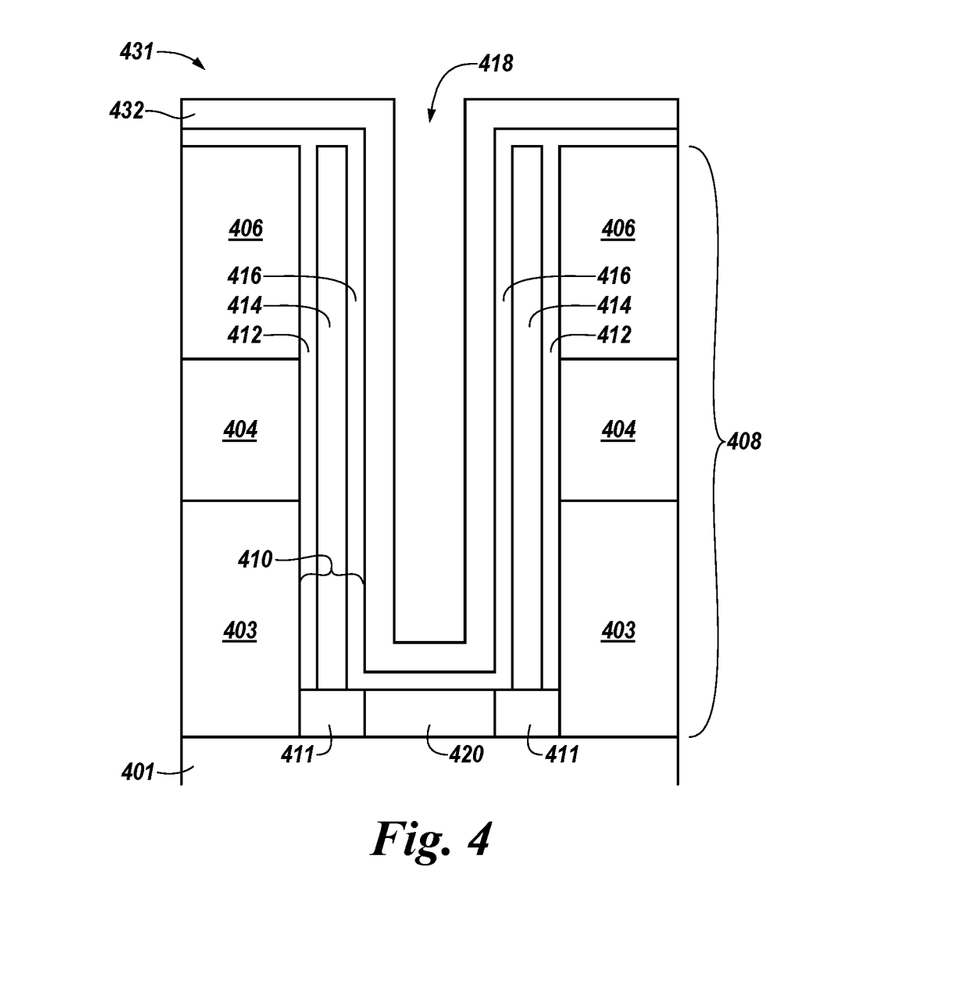
FIGS. 4-7 illustrate cross-sectional views of a portion of an example memory device at various points in time in an example fabrication sequence for selective deposition of a dielectric material on a sidewall of an opening in accordance with a number of embodiments of the present disclosure.

FIG. 4 illustrates a cross-sectional view of a portion of an example memory device at a point 431 in time in an example semiconductor fabrication sequence for selective deposition of a dielectric material on a sidewall of an opening in accordance with a number of embodiments of the present disclosure.

In the example of FIG. 4, a similar process may be used to that described in connection with FIG. 1 in order to form a laminate dielectric 410 intended to electrically isolate sidewalls of semiconductor pillars 108 having conductive layers 403 and 404 therein and separated by an opening 418. According to embodiments described herein a first liner material 432 can be formed on such a dielectric spacer 410 and a bottom conductive surface 420, isolated by spacers 411, of the opening 418, e.g., using a CVD or other suitable process. The first liner material 432 can be formed out of a nitride. The first liner material 432 can be formed on the dielectric spacer 410 and bottom surface 420 of the opening 418 using a non-selective process. The first liner material 432 may be used to protect the third layer 416 of the dielectric spacer 410. For example, a first liner material 432 can protect the portion of the third layer 416 of the dielectric spacer 410 on the sidewalls 408 from a subsequent etching process used to remove the third layer 416 of dielectric spacer 410 from the bottom surface 420 of the opening 418 to expose a conductive material on the bottom surface 420 of the opening 418. The etch process can be a non-selective etching process and, due to a certain aspect ratio of the etch depth, may undesirably etch along the sidewalls 408 of the pillars. For example, an etch process may be utilized to etch via (e.g., through) the third layer 416 of the dielectric spacer 410 formed on the bottom surface 420 of the opening 418.

According to embodiments described herein, the first liner material 432 may attenuate the undesired etching of the dielectric 410 along the sidewalls of the pillars 408. According to embodiments, performance of the etch process may result in the removal of the first liner material 432 and the third layer 416 from the bottom surface to expose the conductive material on the bottom surface 420. In this manner, the etch process may remove the third layer 416 of the dielectric spacer 410 from the bottom surface 420 while protecting from damage the dielectric spacer 410 on the sidewalls 408.

Figure 5:
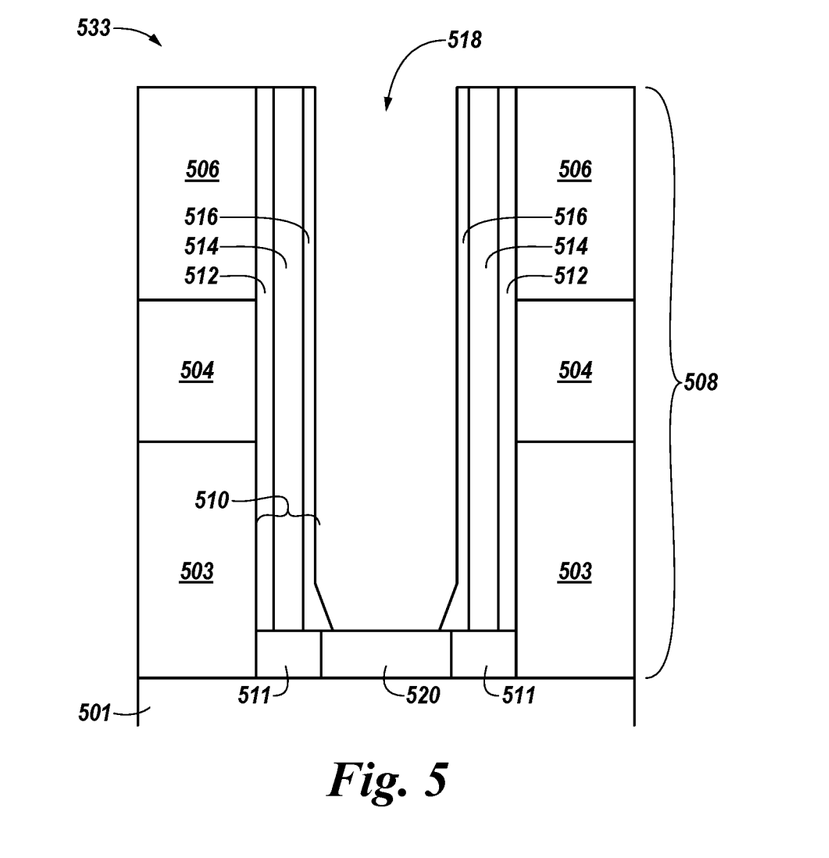

FIG. 5 is analogous or similar to FIG. 4. FIG. 5 illustrates a cross-sectional view of the portion of the example memory device at another point 533 in time in the example fabrication sequence described in connection with FIG. 4 in accordance with a number of embodiments of the present disclosure.

The first liner material (e.g. first liner material 432 as illustrated in FIG. 4) and the third layer of the laminate dielectric 516 may be etched from the bottom surface of the opening 520. The first liner material may protect the laminate dielectric 510 from damage during an etch. Even with the first liner as protection, the portion of the third layer 516 of the laminate dielectric 510 on the sidewalls 508 may be damaged by the etch. This damage may decrease the amount of protection provided to the sidewalls 508 during subsequent processes. With the decreased protection, the damaged caused by the subsequent processes may result in a pinhole (e.g. pinhole 224 as illustrated in FIG. 2).

Figure 6:
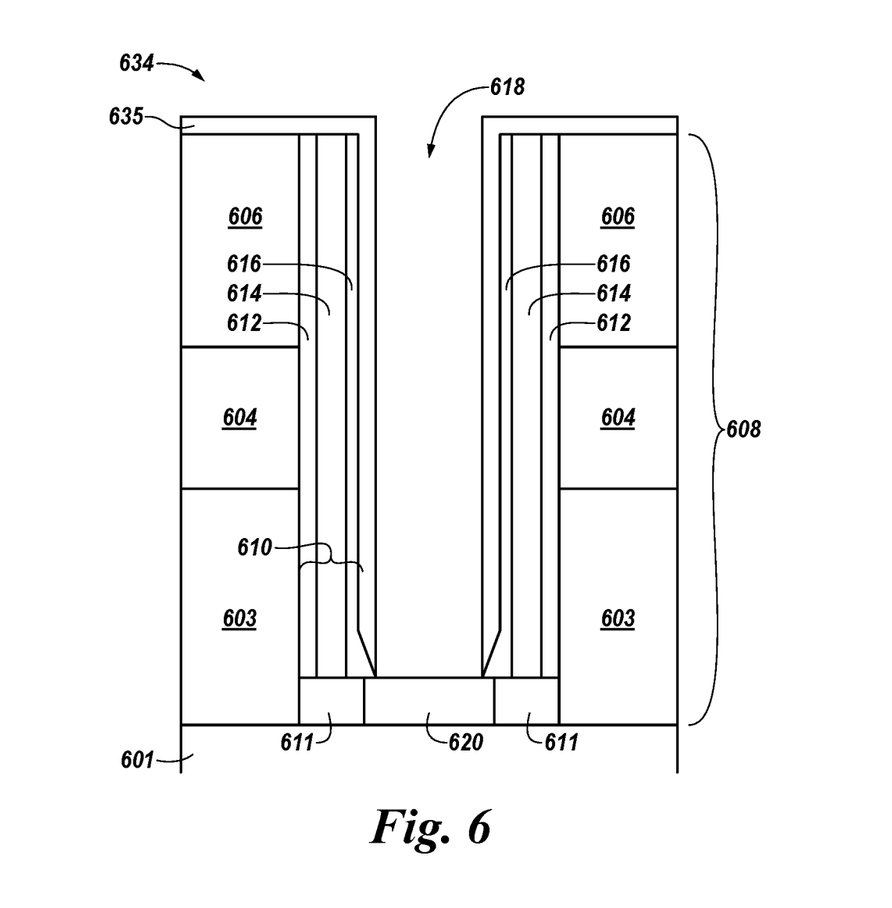

FIG. 6 illustrates a deposition of a second liner material 635. The second liner material 635 can be made out of a nitride. The nitride can be a nitride that can be deposited on other nitrides but not on conductive material.

The second liner material 635 can be selectively deposited. By selectively depositing the second liner material 635, the second liner material 635 can be deposited on a portion of the opening 618 while not being deposited on other portions of the opening 618. For example, the second liner material 635 can be deposited on the dielectric spacer 610 and not the bottom surface 620 of the opening 618. Selectively depositing the second liner material 635 on the dielectric spacer 610 can avoid the process of etching the second liner material 635 from the bottom surface 620 of the opening 618. Selectively depositing the second liner material 635 can create a perpendicular geometry to the bottom surface 620.

As mentioned above, after etching the first liner material (e.g. liner material 432 as illustrated in FIG. 4), there can still be some of the third layer 616 of the dielectric spacer 610 remaining on the bottom surface 620 of the opening 618. An additional etch can be used to remove the remaining portion of the third layer 616 of the dielectric spacer 610 from the bottom surface 620 of the opening 618. Since this additional etch may not be used to remove the entire third layer 616 of the dielectric spacer 610, it can be a weaker etch than an etch that may be used to remove both the third layer 616 of the dielectric spacer 610 and the second liner material 635 from the bottom surface 620 of the opening 618. By removing the remaining third layer 616 material, a larger area of the bottom surface 620 of the opening 618 may be able to utilize its conductive properties. Further, since the etch is weaker, it may not cause as much damage to the dielectric spacer 610 or the second liner material 635.

Figure 7:
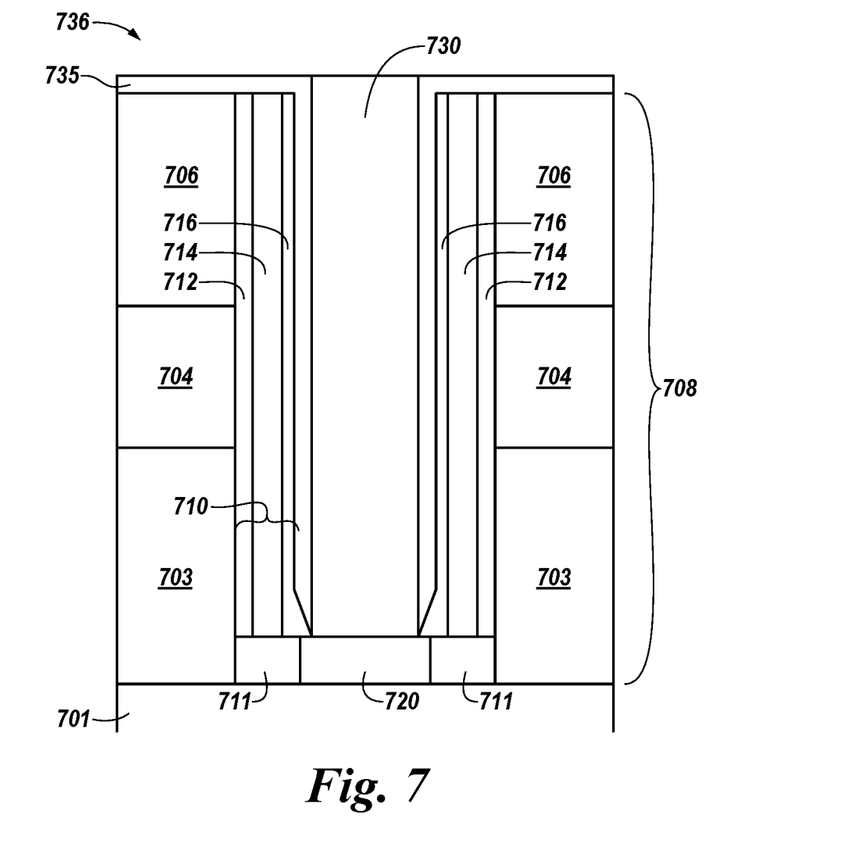

FIG. 7 is analogous or similar to FIG. 6. FIG. 7 illustrates filling the opening after the second liner material has been selectively deposited on the dielectric spacer and optionally performing the additional weaker bottom cleaning etch.

FIG. 7 illustrates an opening (e.g. opening 618 as illustrated in FIG. 6) filled with a conductive fill 730. For example, the conductive fill 730 can be polysilicon. The second liner material 735 can be used as a layer of separation between the conductive fill 730 and the sidewall 708. The second liner material 735 can be selectively deposited onto a dielectric material and not a conductive material. By selectively depositing the second liner material 735, the second liner material may be deposited on the laminate spacer 710 and not on the bottom surface 720 of the opening.

Figure 8:
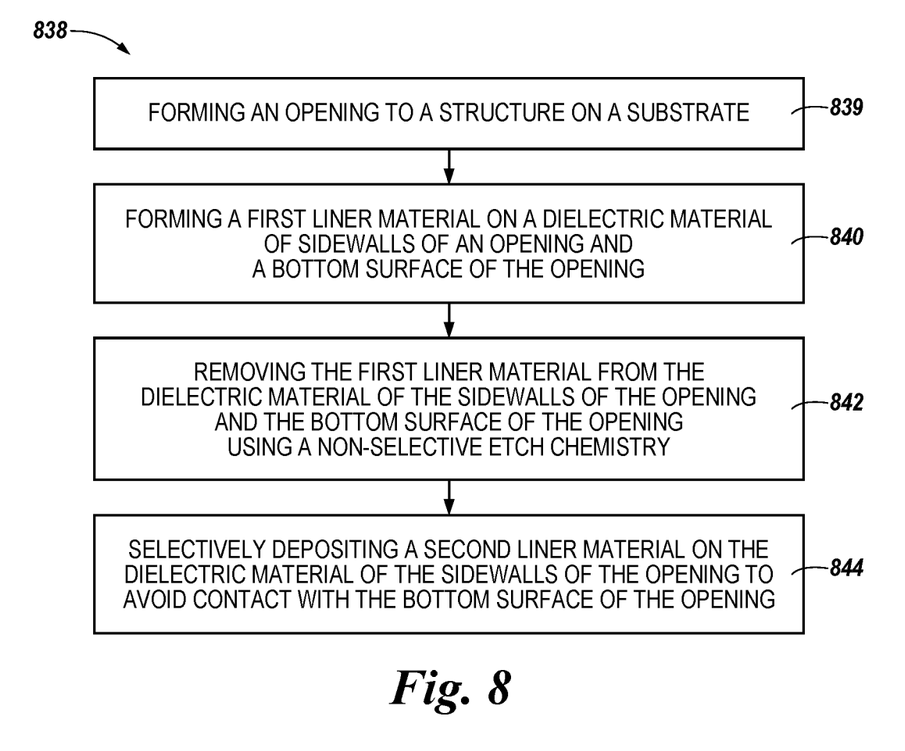
FIGS. 8-10 are flow diagrams of example methods for selective deposition of a dielectric material on a sidewall of an opening in accordance with a number of embodiments of the present disclosure.

FIG. 8 is a flow diagram of an example method 838 for selective deposition of a dielectric material on a sidewall of an opening in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 839, the method 838 may include forming an opening to a structure on a substrate. A number of materials may be deposited on a substrate. Some materials may be deposited on another materials. An etch may then be performed to form an opening through the materials to the underlying substrate.

At block 840, the method 838 may include forming a first liner material on a dielectric material of sidewalls of an opening and a bottom surface of an opening (e.g., as described in connection with FIG. 4). The first liner material may be formed out of a nitride. At block 842, the method 838 may include removing the first liner material from the dielectric material of the sidewalls of the opening and the bottom surface of the opening using a non-selective etch chemistry. At block 844, the method 838 may include selectively depositing a second liner material on the dielectric material of the sidewalls of the opening to avoid contact with the bottom surface of the opening.

The method 838 may, in a number of embodiments, further include, forming the first liner material out of a nitride (e.g., as described in connection with FIG. 1). The method 838 may further include forming the first and second liner material on a laminate dielectric of the sidewalls.

The method 838 may further include, forming the laminate dielectric material out of a plurality of layers of dielectric material of the sidewalls (e.g., as described in connection with FIG. 1). The method 838 may further include forming the first layer of the dielectric spacer out of either a low k dielectric material or a first nitride, forming the second layer out of an oxide, and forming the third layer out of a second nitride. The method 838 may further include forming a third layer of the laminate dielectric material on a first layer of the dielectric laminate material, a second layer of the dielectric laminate material, and the bottom surface of the opening. The method 838 may further include forming the laminate dielectric material to have a lower k than a dielectric material made of a solid nitride. The method 838 may further include determining the k of the laminate dielectric material by averaging the k of the layers of the laminate dielectric material (e.g., as described in connection with FIG. 1).

Figure 9:
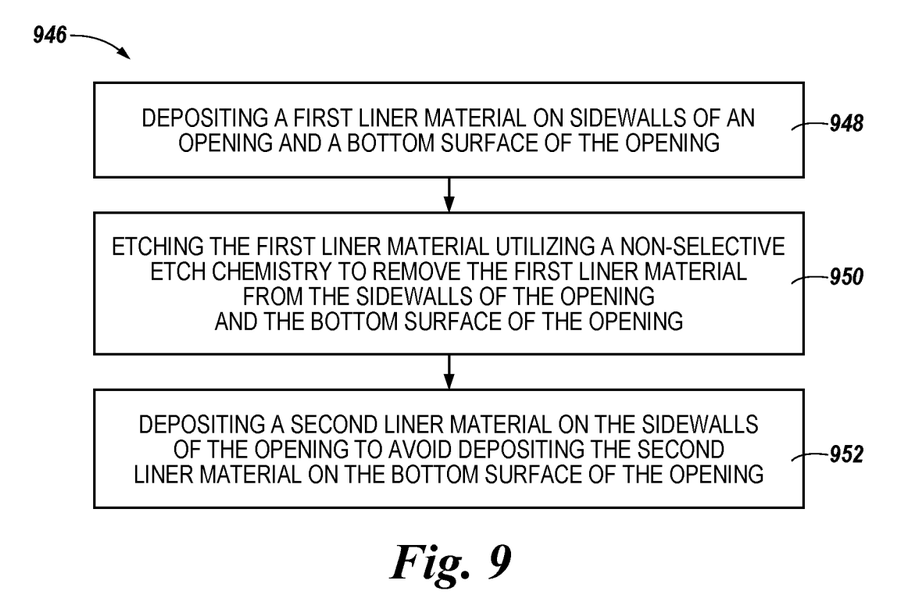

FIG. 9 is a flow diagram of another example method 946 for selective deposition of a dielectric material on a sidewall of an opening in accordance with a number of embodiments of the present disclosure.

At block 948, the method 946 may include depositing a first liner material on sidewalls of an opening and a bottom surface of the opening (e.g., as described in connection with FIG. 2). At block 950, the method 946 may include etching the first liner material utilizing a non-selective etch chemistry, to remove the first liner material from the sidewalls of the opening and the bottom surface of the opening (e.g., as described in connection with FIG. 5). At block 952, the method 946 may include depositing a second liner material on the sidewalls of the opening to avoid depositing the second liner material on the bottom surface of the opening.

The method 946 may, in a number of embodiments, further include etching the first liner material using a plasma etch (e.g., as described in connection with FIG. 2). The method 946 may further include, etching to remove a layer of dielectric material from the bottom surface of the opening (e.g., as described in connection with FIG. 2). The method 946 may include using a weaker etch to remove the layer of the dielectric material from the bottom surface of the opening compared to an etch to remove both the layer of dielectric material and a liner material from the bottom surface of the opening. The weaker etch may cause less damage to the second liner than an etch to remove both the layer of dielectric material and a liner material from the bottom surface of the opening.

Figure 10:
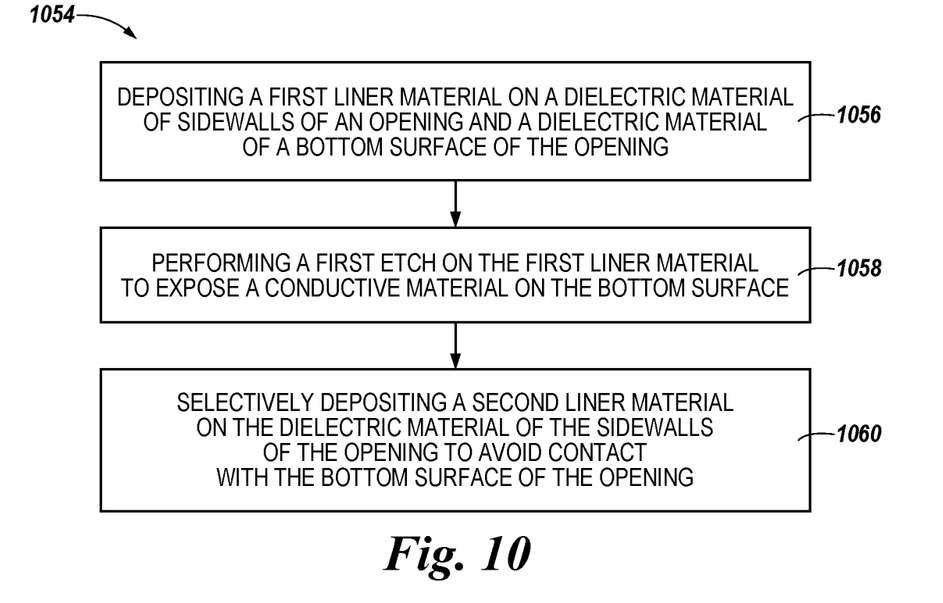

FIG. 10 is a flow diagram of another example method 1054 for selective deposition of a dielectric material on a sidewall of an opening in accordance with a number of embodiments of the present disclosure.

At block 1056, the method 1054 may include depositing a first liner material on a dielectric material of sidewalls of an opening and a dielectric material of a bottom of the opening (e.g., as described in connection with FIG. 4). At block 1058, the method 1054 may include performing a first etch on the first liner material to expose a conductive material on the bottom surface (e.g., as described in connection with FIG. 5). At block 1060, the method 1054 may include selectively depositing a second liner material on the dielectric material of the sidewalls of the opening to avoid contact with the bottom surface of the opening (e.g., as described in connection with FIG. 6).

The method 1054 may, in a number of embodiments, further include forming a second liner to create a perpendicular geometry to the bottom surface (e.g., as described in connection with FIG. 4). The method 1054 may further include forming a second liner material out of a dielectric material that can selectively deposit on other dielectric material but not on conductive material. The second liner material can be formed out of a different nitride than the dielectric material of the sidewalls of the opening. The method 1054 may further include removing portions of the dielectric material on the bottom surface of the opening when performing an etch of the first liner material. A second etch can be performed that is weaker than the first etch to remove the remaining dielectric material from the bottom surface of the opening.

Figure 11:
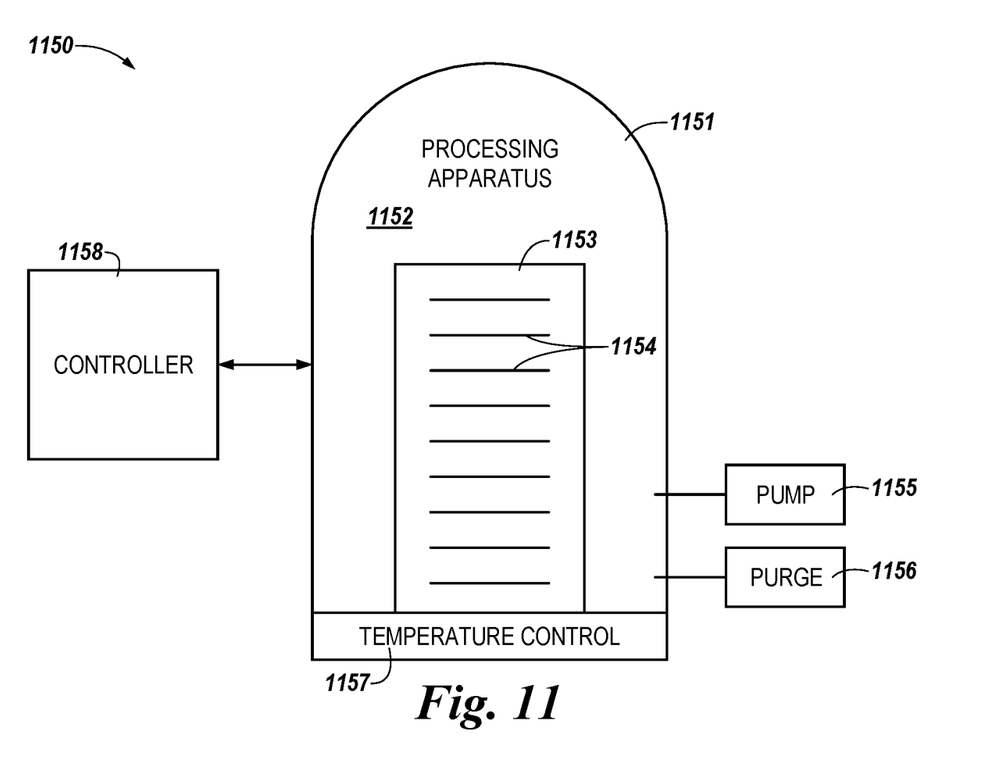
FIG. 11 is a functional block diagram of a system for implementation of an example semiconductor fabrication process in accordance with a number of embodiments of the present disclosure.

FIG. 11 is a functional block diagram of a system 1150 for implementation of an example semiconductor fabrication process in accordance with a number of embodiments of the present disclosure. The numbering convention used in connection with FIG. 11 does not follow the earlier introduced numbering convention and sequence that applies to FIGS. 1-10. The system 1150 may include a processing apparatus 1151. The processing apparatus 1151 may be configured to enable formation of structural materials on and/or removal of structural materials from a semiconductor device during fabrication of the semiconductor device.

The processing apparatus 1151 may include a chamber 1152 to enclose components configured to perform deposition and/or etch operations on a number of semiconductor devices (e.g., wafers on which memory devices 1212 or arrays 1214 are being formed by the example semiconductor fabrication sequence 100). The chamber 1152 may further enclose a carrier 1153 to hold a batch of semiconductor wafers 1154. The processing apparatus 1151 may include and/or be associated with tools including, for example, a pump 1155 unit and a purge 1156 unit configured to introduce and remove appropriate etch chemistries, as described herein, at each point in the semiconductor fabrication sequence (e.g., as described in connection with the fabrication sequence 431 shown in FIG. 4). The processing apparatus 1151 may further include a temperature control 1157 unit configured to maintain the chamber 1152 at an appropriate temperature at each of the points in the fabrication sequence 431. The system 1150 may include a number of chambers 1152 that are each configured to perform particular processes (e.g., a wet etch process, a dry etch process, and/or a deposition process, among others) during the fabrication sequence 431.

The system 1150 may further include a controller 1158. The controller 1158 may include, or be associated with, circuitry and/or programming for implementation of, for instance, deposition and removal of passivation material for pillars adjacent a trench, along with etching of substrate material. Adjustment of such deposition, removal, and etching operations by the controller 1158 may control the critical dimensions (CDs) of the semiconductor devices created in the processing apparatus 1151.

A host may be configured to generate instructions related to protection of a top region of a pillar and an adjacent trench during removal of a substrate material at a bottom region of a trench of the semiconductor device. An example of a host is shown at 1202 in FIG. 12, although embodiments are not limited to being coupled to the memory system 1204 shown in FIG. 12. The instructions may be sent via a host interface 1203 to the controller 1158 of the processing apparatus 1151. The instructions may be based at least in part on scaled preferences (e.g., in numerically and/or structurally defined gradients) stored by the host 1102, provided via input from another storage system (not shown), and/or provided via input from a user (e.g., a human operator), among other possibilities. The controller 1158 may be configured to enable input of the instructions and scaled preferences to define the CDs of the fabrication of the semiconductor device to be implemented by the processing apparatus 1151 based at least in part on performance of the four operations presented below and described in more detail in connection with FIG. 4.

The scaled preferences may determine final structures (e.g., the CDs) of the top region of the pillar, a sidewall of the pillar, a width of the pillar, a width of the trench, and/or a depth of the trench. Particular CDs may be enabled by the particular scaled preferences that are input via the instructions. Receipt and implementation of the scaled preferences by the controller 1158 may result in corresponding adjustment, by the processing apparatus 1151, of a deposition time for the passivation material, adjustment of a coverage area, height, and/or volume of the passivation material, adjustment of a trim direction and/or trim time performed on the passivation material, and/or adjustment of punch etch direction and/or punch etch time performed on the substrate material, among implementation of other possible scaled preferences.

The controller 1158 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent a trench, along with formation of passivation material on and removal of the passivation material from the pillar and the trench.

The controller 1158 may be configured to receive the instructions and direct performance of operations, corresponding to the instructions, by the processing apparatus 1151. In a number of embodiments, the four operations performed by the processing apparatus 1151 may be to form a passivation material on a top region of a pillar adjacent the trench, remove a first portion of the passivation material to form, on a remaining second portion of the passivation material, a surface that is coplanar with an underlying sidewall of the pillar, remove a portion of the substrate material at the bottom region of the trench, and remove the remaining second portion of the passivation material from the top region.

The controller 1158 may be configured to implement the instructions to control a quantity of the passivation material that is formed on and removed from the top region of the pillar. The quantity of the passivation material may be controlled to adjust a quantity of material associated with the top region of the pillar that is removed, a width of a least a portion of the trench, a roughness of at least a portion of a sidewall of the trench, and/or a width of a least a portion of the pillar. The controller 1158 may be configured to implement the instructions to control a depth of the removal of the substrate material based at least in part on a quantity of the second portion of the passivation material remaining on the top region to protect an underlying material of the top region. For example, a punch etch being performed on the substrate material may be stopped at a depth that coincides with the second portion of the passivation material remaining on the top region being reduced to a predetermined thickness that is determined to be adequate for protection of the underlying material of the top region. The controller 1158 may be configured to implement the instructions to control reaching an intended depth of the removal of the substrate material based at least in part on a number of iterations of the four operations presented above.

Figure 12:
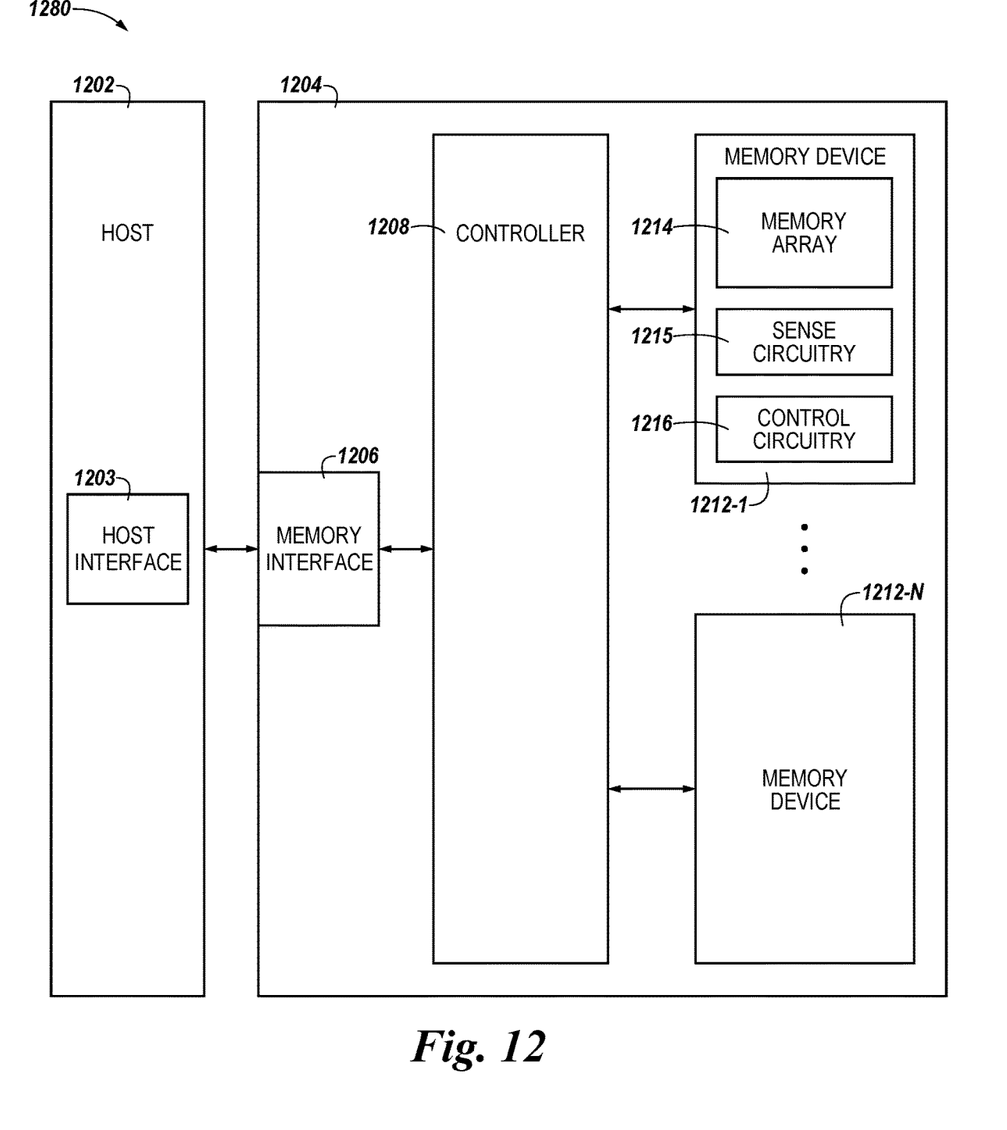
FIG. 12 is a functional block diagram of a computing system including at least one memory system in accordance with one or more embodiments of the present disclosure.

FIG. 12 is a functional block diagram of a computing system 1280 including at least one memory system 1204 in accordance with one or more embodiments of the present disclosure. The numbering convention used in connection with FIG. 12 does not follow the earlier introduced numbering convention and sequence that applies to FIGS. 1-10. Memory system 1204 may be, for example, a solid-state drive (SSD).

In the embodiment illustrated in FIG. 12, memory system 1204 includes a memory interface 1206, a number of memory devices 1212-1, . . . , 212-N, and a controller 1208 selectably coupled to the memory interface 1206 and memory devices 1212-1, . . . , 1212-N. Memory interface 1206 may be used to communicate information between memory system 1204 and another device, such as a host 1202. Host 1202 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 1202 may be associated with fabrication operations performed on semiconductor devices and/or SSDs using, for example, a processing apparatus shown at 1151 and described in connection with FIG. 11.

In a number of embodiments, host 1202 may be associated with (e.g., include or be coupled to) a host interface 1203. The host interface 1203 may enable input of scaled preferences (e.g., in numerically and/or structurally defined gradients) to define, for example, critical dimensions (CDs) of a final structure or intermediary structures of a memory device (e.g., as shown at 1212) and/or an array of memory cells (e.g., as shown at 1214) formed thereon to be implemented by the processing apparatus 1151. The scaled preferences may be provided to the host interface 1203 via input of a number of preferences stored by the host 1202, input of preferences from another storage system (not shown), and/or input of preferences by a user (e.g., a human operator).

Memory interface 1206 may be in the form of a standardized physical interface. For example, when memory system 1204 is used for information (e.g., data) storage in computing system 1280, memory interface 1206 may be a serial advanced technology attachment (SATA) interface, a peripheral component interconnect express (PCIe) interface, or a universal serial bus (USB) interface, among other physical connectors and/or interfaces. In general, however, memory interface 1206 may provide an interface for passing control, address, information, scaled preferences, and/or other signals between the controller 1208 of memory system 1204 and a host 1202 (e.g., via host interface 1203).

Controller 1208 may include, for example, firmware and/or control circuitry (e.g., hardware). Controller 1208 may be operably coupled to and/or included on the same physical device (e.g., a die) as one or more of the memory devices 1212-1, . . . , 1212-N. For example, controller 1208 may be, or may include, an ASIC as hardware operably coupled to circuitry (e.g., a printed circuit board) including memory interface 1206 and memory devices 1212-1, . . . , 1212-N. Alternatively, controller 1208 may be included on a separate physical device that is communicatively coupled to the physical device (e.g., the die) that includes one or more of the memory devices 1212-1, . . . , 1212-N.

Controller 1208 may communicate with memory devices 1212-1, . . . , 1212-N to direct operations to sense (e.g., read), program (e.g., write), and/or erase information, among other functions and/or operations for management of memory cells. Controller 1208 may have circuitry that may include a number of integrated circuits and/or discrete components. In a number of embodiments, the circuitry in controller 1208 may include control circuitry for controlling access across memory devices 1212-1, . . . , 1212-N and/or circuitry for providing a translation layer between host 1202 and memory system 1204.

Memory devices 1212-1, . . . , 1212-N may include, for example, a number of memory arrays 1214 (e.g., arrays of volatile and/or non-volatile memory cells). For instance, memory devices 1212-1, . . . , 1212-N may include arrays of memory cells, such as a portion of an example memory device 1390 structured to include pillars and adjacent trenches described in connection with FIG. 13. As will be appreciated, the memory cells in the memory arrays 1214 of memory devices 1212-1, . . . , 1212-N and/or as shown at 1390 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 1212, 1390 may be formed on the same die. A memory device (e.g., memory device 1212-1) may include one or more arrays 1214 of memory cells formed on the die. A memory device may include sense circuitry 1215 and control circuitry 1216 associated with one or more arrays 1214 formed on the die, or portions thereof. The sense circuitry 1215 may be utilized to determine (sense) a particular data value (e.g., 0 or 1) that is stored at a particular memory cell in a row of an array 1214. The control circuitry 1216 may be utilized to direct the sense circuitry 1215 to sense particular data values, in addition to directing storage, erasure, etc., of data values in response to a command from host 1202 and/or host interface 1203. The command may be sent directly to the control circuitry 1216 via the memory interface 1206 or to the control circuitry 1216 via the controller 1208.

The embodiment illustrated in FIG. 12 may include additional circuitry that is not illustrated so as not to obscure embodiments of the present disclosure. For example, memory devices 1212, 1390 may include address circuitry to latch address signals provided over I/O connectors through I/O circuitry. Address signals may be received and decoded by a row decoder and a column decoder to access a memory array 1214. It will be appreciated that the number of address input connectors may depend on the density and/or architecture of memory devices 1212, 1390 and/or memory arrays 1214.

Figure 13:
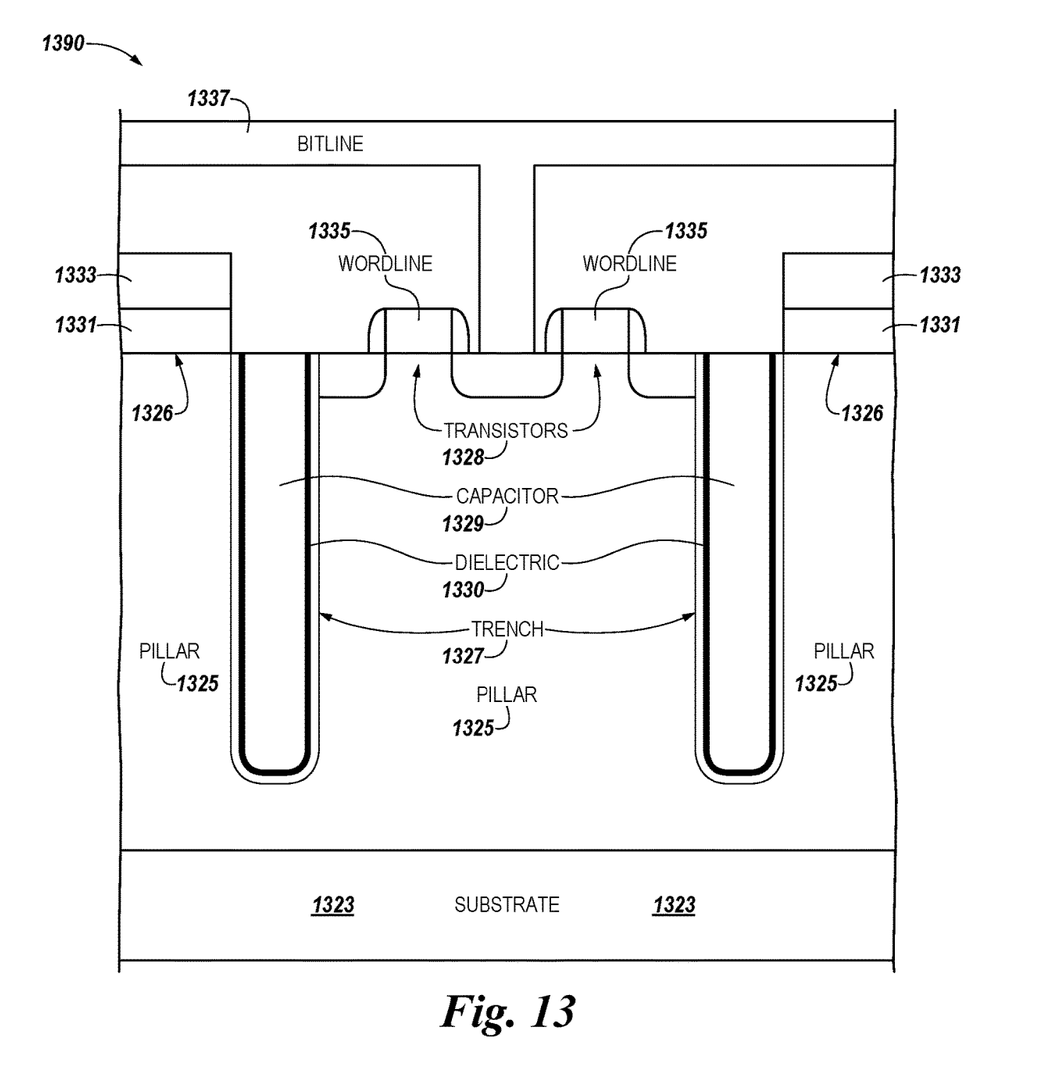
FIG. 13 illustrates a cross-sectional view of a portion of an example of semiconductor structures of a memory device that include pillars and adjacent trenches in accordance with a number of embodiments of the present disclosure

FIG. 13 illustrates a cross-sectional view of a portion of an example of semiconductor structures of a memory device 1390 that include pillars and adjacent trenches in accordance with a number of embodiments of the present disclosure. The portion of the memory device 1390 illustrated in FIG. 13 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1328 and capacitors 1329 are shown to be arranged in a lateral configuration, embodiments may include the transistors 1328 and capacitors 1329 being arranged in a lateral, a vertical, or any other configuration.

The portion of the memory device 1390 shown in FIG. 6 may represent two DRAM memory cells in a 1T1C (one transistor one capacitor) configuration or one DRAM memory cell in a 2T2C configuration. DRAM memory cells may utilize capacitors 1329 each formed in a trench 1327 to store a particular charge corresponding to a data value. Forming the trenches 1327 as shown in FIG. 13 may result in a pillar 1325 being formed from the etched material on each side of a trench 1327. Pillars 1325 may be formed (e.g., fabricated) as layers of doped or undoped semiconductor material deposited on a substrate material 1323. The semiconductor material may be etched to form the pillars 1325 and trenches 1327. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1327 may be etched to a particular depth into a pillar material. The trench 1327 may be etched into the material of the pillars 1325 to a depth approaching the substrate material 1323, as shown in FIG. 6. The depth of the trench 1327 approaching, at the top of, and/or into the substrate material 1323 is termed herein as being in the bottom region of the trench.

As described herein, deepening (e.g., etching) the trench further into the pillar material or the substrate material may increase a surface area of the trench boundaries. In one example, increasing the surface area of the trench boundaries may increase a capacitance of a capacitor 1329 formed in the trench 1327 (e.g., by increasing a volume and/or surface area of the capacitor). In this example, the trench 1327 may be lined with a dielectric material 1330 and a capacitor material may be formed (e.g., deposited) within the trench 1327 and on the dielectric material 1330 to form the capacitor 1129 to a particular (e.g., target) depth.

Each pillar 1325 of the pillar material may extend to a particular height above the substrate material 1323. As such, each pillar 1325 has a top surface 1326 at the particular height. A number of structural materials may be formed on or in association with the top surface 1326 of the pillar 1325 adjacent the trench 1327. For example, a particular material 1331 may be formed to contribute to data access, storage, and/or processing (e.g., conductor, resistor, and/or dielectric materials). Such a material 1331 may be formed on the top surface 1326 of the pillar 1325 adjacent the trench 1327. A mask material 1333 may be formed to protect an underlying material 1331 and/or the top surface 1326 of the pillar 1325 adjacent the trench 1327 from subsequent processing and/or wear encountered in use of the memory device 1390. Other structural materials that may be formed (e.g., in a DRAM configuration as shown in FIG. 13) on or in association with the top surface 1326 of the pillar 1325 adjacent the trench 1327. The other structural materials may include the transistors 1328, wordlines 1335, and/or bitlines 1337, among other possible structural materials. The structural materials just described as being formed on and/or in association with the top surface 1326 of the pillar 1325 adjacent the trench 1327 are termed herein as being in a top region of the pillar 1325 and/or trench 1327.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to reduction of roughness on a sidewall of an opening, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to reduction of roughness on a sidewall of an opening than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   forming a first liner material on a dielectric material on sidewalls of an opening and a bottom surface of the opening;
   removing the first liner material from the dielectric material on the sidewalls of the opening, and both the first liner material and the dielectric material from the bottom surface of the opening using a non-selective etch chemistry, wherein removing the first liner material from the dielectric material on the sidewalls exposes the dielectric material on the sidewalls; and
   forming a second liner material on the dielectric material on the sidewalls of the opening to avoid contact with the bottom surface of the opening.

2. The method of claim 1, further comprising forming the first liner material out of a nitride.

3. The method of claim 1, further comprising forming the first liner material and the second liner material on a laminate dielectric material on the sidewalls.

4. The method of claim 3, further comprising forming the laminate dielectric material out of a plurality of layers of the dielectric material on the sidewalls.

5. The method of claim 4, further comprising:
   forming a first layer of the laminate dielectric material out of a low dielectric constant (k) material;
   forming a second layer of the laminate dielectric material out of an oxide; and
   forming a third layer of the laminate dielectric material out of a nitride.

6. The method of claim 4, further comprising forming:
   a first layer of the laminate dielectric material out of a first nitride;
   a second layer of the laminate dielectric material out of an oxide; and
   a third layer of the laminate dielectric material out of a second nitride.

7. The method of claim 4, further comprising forming a third layer of the laminate dielectric material on a first layer of the dielectric laminate material, a second layer of the dielectric laminate material, and the bottom surface of the opening.

8. The method of claim 4, further comprising forming the laminate dielectric material to have a lower k than a dielectric material made of a solid nitride.

9. The method of claim 4, further comprising determining a k of the laminate dielectric material by averaging a k of the layers of the laminate dielectric material.

10. A method, comprising:
    depositing a first liner material on a multilayer dielectric material on sidewalls of an opening and a layer of the multilayer dielectric material on a bottom surface of the opening;
    etching the first liner material and the multilayer dielectric material utilizing a non-selective etch chemistry, to remove the first liner material from the multilayer dielectric material on the sidewalls of the opening and remove the first liner material and the layer of the multilayer dielectric material from the bottom surface of the opening; and
    depositing a second liner material on the multilayer dielectric material on the sidewalls of the opening to avoid depositing the second liner material on the bottom surface of the opening.

11. The method of claim 10, further comprising etching the first liner material using a plasma etch.

12. The method of claim 10, further comprising performing an additional etch to remove a remaining portion of the layer of the multilayer dielectric material from the bottom surface of the opening.

13. The method of claim 12, wherein the additional etch causes less damage to the second liner material than the etch to remove both the layer of the multilayer dielectric material and the first liner material from the bottom surface of the opening.

14. A method, comprising:
    depositing a first liner material on a multilayer dielectric material on sidewalls of an opening and a layer of the multilayer dielectric material on a bottom surface of the opening;
    performing a first etch on the first liner material and the layer of the multilayer dielectric material to remove the first liner material from the multilayer dielectric material on the sidewalls of the opening and to remove the first liner material and the layer of the multilayer dielectric material from the bottom surface of the opening; and
    selectively depositing a second liner material on the multilayer dielectric material on the sidewalls of the opening to avoid contact with the bottom surface of the opening, wherein the bottom surface of the opening is conductive.

15. The method of claim 14, further comprising forming the second liner material to create a perpendicular geometry to the bottom surface.

16. The method of claim 14, further comprising forming the second liner material out of a dielectric material that can selectively deposit on other dielectric material but not on conductive material.

17. The method of claim 14, further comprising forming the second liner material out of a different nitride than the multilayer dielectric material on the sidewalls of the opening.

18. The method of claim 14, further comprising performing a second etch that causes less damage to the second liner material than the first etch to remove a remaining portion of the layer of the multilayer dielectric material from the bottom surface of the opening.

* * * * *